United States Patent
Balchandani et al.

(10) Patent No.: US 8,473,536 B2
(45) Date of Patent: Jun. 25, 2013

(54) ALGORITHM FOR ADIABATIC PULSE DESIGN USING THE SHINNAR LE-ROUX TRANSFORM

(75) Inventors: Priti Balchandani, Menlo Park, CA (US); John M. Pauly, Stanford, CA (US); Daniel M. Spielman, Menlo Park, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 1038 days.

(21) Appl. No.: 12/489,285

(22) Filed: Jun. 22, 2009

(65) Prior Publication Data

US 2010/0325185 A1 Dec. 23, 2010

(51) Int. Cl.
*G06F 15/00* (2006.01)
*G06F 7/00* (2006.01)

(52) U.S. Cl.
USPC ............ 708/403; 708/131; 708/270; 708/400

(58) Field of Classification Search
None
See application file for complete search history.

(56) References Cited

U.S. PATENT DOCUMENTS

| | | | |
|---|---|---|---|
| 2008/0111547 A1* | 5/2008 | Alsop | 324/309 |
| 2011/0144474 A1* | 6/2011 | Ouwerkerk | 600/410 |

OTHER PUBLICATIONS

Pauly J, Nishimura D, Macovski A., "*Quasi-Adiabatic Inversion Pulses,*" In Proc., SMRM, 9th Annual Meeting, New York, 1990; 417.
Pauly J, Le Roux P, Nishimura D, Macovski A., "*Parameter Relations for the Shinnar-Le Roux Selective Excitation Pulse Design Algorithm,*" IEEE Trans Med Imaging 1991; 10(1):53-65.
Schulte RF, Tsao J, Boesiger P, Pruessmann KP., "*Equi-Ripple Design of Quadratic-Phase RF Pulses,*" J Magn Reson 2004; 166(1):111-122.

* cited by examiner

*Primary Examiner* — Scott Sun
(74) *Attorney, Agent, or Firm* — Beyer Law Group LLP

(57) ABSTRACT

A method for providing an adiabatic RF pulse that is an inversion or refocusing pulse for a RF pulse sequence is provided. A linear phase frequency profile ($F_{lp}(\omega)$) is determined for the adiabatic RF pulse. A quadratic phase is applied to the linear phase frequency profile for the adiabatic RF pulse to obtain $F(\omega)$, wherein the applying the quadratic phase comprises setting $F(\omega)=F_{lp}(\omega)e^{ik\omega^2}$. A polynomial $\beta$ is set to equal a Fourier Transform ($F(\omega)$). A corresponding minimum phase $\alpha$ polynomial is determined for the $\beta$ polynomial. ($\alpha,\beta$) are set as inputs to an inverse Shinnar Le-Roux transform to generate an adiabatic RF waveform. The adiabatic RF waveform is truncated to produce the adiabatic RF pulse, wherein $k>0.03\pi/(\omega_s-\omega_p)/(N+1)$ and $k<k_{max}$, where $k_{max}$ is a value at which the adiabatic RF pulse is truncated at 25% of a maximum RF amplitude.

20 Claims, 15 Drawing Sheets

ALGORITHM FOR ADIABATIC PULSE DESIGN USING THE SHINNAR LE-ROUX TRANSFORM

FEDERALLY-SPONSORED RESEARCH OR DEVELOPMENT

This invention was made with Government support under contracts RR009784 and MH080913 awarded by the National Institutes of Health. The Government has certain rights in this invention.

BACKGROUND OF THE INVENTION

This invention relates generally to magnetic resonance imaging (MRI)

Magnetic resonance imaging (MRI) requires placing an object to be imaged in a static magnetic field ($B_0$), exciting nuclear spins in the object with a RF magnetic field ($B_1$), and then detecting signals emitted by the excited spins as they precess within the magnetic field ($B_0$). Through the use of magnetic gradient and phase encoding of the excited magnetization, detected signals can be spatially localized in three dimensions.

SUMMARY

A manifestation of the invention provides a computer implemented method for providing an adiabatic RF pulse that is an inversion or refocusing pulse for a RF pulse sequence, for a magnetic resonance imaging system. A linear phase frequency profile ($F_{lp}(\omega)$) is determined for the adiabatic RF pulse. A quadratic phase is applied to the linear phase frequency profile for the adiabatic RF pulse to obtain $F(\omega)$, wherein the applying the quadratic phase comprises setting $F(\omega)=F_{lp}(\omega)e^{ik\omega^2}$, where k is a specified constant and $\omega$ is a frequency vector over which the spectral profile is defined. A polynomial $\beta$ is set to equal a Fourier Transform ($F(\omega)$). A corresponding minimum phase $\alpha$ polynomial is determined for the $\beta$ polynomial. $(\alpha,\beta)$ are set as inputs to an inverse Shinnar Le-Roux transform to generate an adiabatic RF waveform. The adiabatic RF waveform is truncated to produce the adiabatic RF pulse, wherein a pulse duration and a transition width is specified, wherein $k>0.03\pi/$(effective transition width) where effective transition width is given by $(\omega_s-\omega_p)/(N+1)$ and $k<k_{max}$, where $k_{max}$ is a value at which the adiabatic RF pulse is truncated at 25% of a maximum RF amplitude.

In another manifestation of the invention, a method for magnetic resonance imaging (MRI) in an MRI system is provided. An adiabatic RF pulse that is an inversion or refocusing pulse for a RF pulse sequence is designed for a magnetic resonance imaging system, comprising determining a linear phase frequency profile ($F_{lp}(\omega)$) for the adiabatic RF pulse, applying a quadratic phase to the linear phase frequency profile for the adiabatic RF pulse to obtain $F(\omega)$, wherein the applying the quadratic phase comprises setting $F(\omega)=F_{lp}(\omega) e^{ik\omega^2}$, where k is a specified constant and $\omega$ is a frequency vector over which the spectral profile is defined, setting a polynomial $\beta$=Fourier Transform ($F(\omega)$), determining a corresponding minimum phase $\alpha$ polynomial for the $\beta$ polynomial, setting $(\alpha,\beta)$ as inputs to an inverse Shinnar Le-Roux transform to generate an adiabatic RF waveform, and truncating the adiabatic RF waveform to produce the adiabatic RF pulse, wherein a pulse duration and a transition width is specified, wherein $k>0.03\pi/$(effective transition width) where effective transition width is given by $(\omega_s-\omega_p)/(N+1)$ and $k<k_{max}$, where $k_{max}$ is a value at which the adiabatic RF pulse is truncated at 25% of a maximum RF amplitude. A $B_0$ field is applied. A sequence of RF pulses including the designed adiabatic RF pulse for excitation is applied. A signal is read out at an echo. An image is created from a Fourier transform of the read out signal.

In another manifestation of the invention, an apparatus for providing magnetic resonance imaging is provided. A magnetic resonance imaging excitation and detection system is provided. A controller is electrically connected to the magnetic resonance imaging excitation and detection system, comprising a display, at least one processor, and computer readable media. The computer readable media comprises computer readable code for designing an adiabatic RF pulse that is an inversion or refocusing pulse for a RF pulse sequence for the magnetic resonance imaging and detection system, computer readable code for applying the a sequence of RF pulses including designed adiabatic RF pulse for excitation, computer readable code for reading out a signal at an echo, and computer readable code for creating an image from a Fourier transform of the read out signal. The computer readable code for designing an adiabatic RF pulse that is an inversion or refocusing pulse for a RF pulse sequence comprises computer readable code for determining a linear phase frequency profile ($F_{lp}(\omega)$) for the adiabatic RF pulse, computer readable code for applying a quadratic phase to the linear phase frequency profile for the adiabatic RF pulse to obtain $F(\omega)$, wherein the applying the quadratic phase comprises setting $F(\omega)=F_{lp}(\omega)e^{ik\omega^2}$, where k is a specified constant and $\omega$ is a frequency vector over which the spectral profile is defined, computer readable code for setting a polynomial $\beta$=Fourier Transform ($F(\omega)$), computer readable code for determining a corresponding minimum phase $\alpha$ polynomial for the $\beta$ polynomial, computer readable code for setting $(\alpha,\beta)$ as inputs to an inverse Shinnar Le-Roux transform to generate an adiabatic RF waveform, and computer readable code for truncating the adiabatic RF waveform to produce the adiabatic RF pulse, wherein a pulse duration and a transition width is specified, wherein $k>0.03\pi/$(effective transition width) where effective transition width is given by $(\omega_s-\omega_p)/(N+1)$ and $k<k_{max}$, where $k_{max}$ is a value at which the adiabatic RF pulse is truncated at 25% of a maximum RF amplitude.

The invention and objects and features thereof will be more readily apparent from the following detailed description and appended claims when taken with the drawings.

DETAILED DESCRIPTION OF ILLUSTRATIVE EMBODIMENTS

Figure 1:
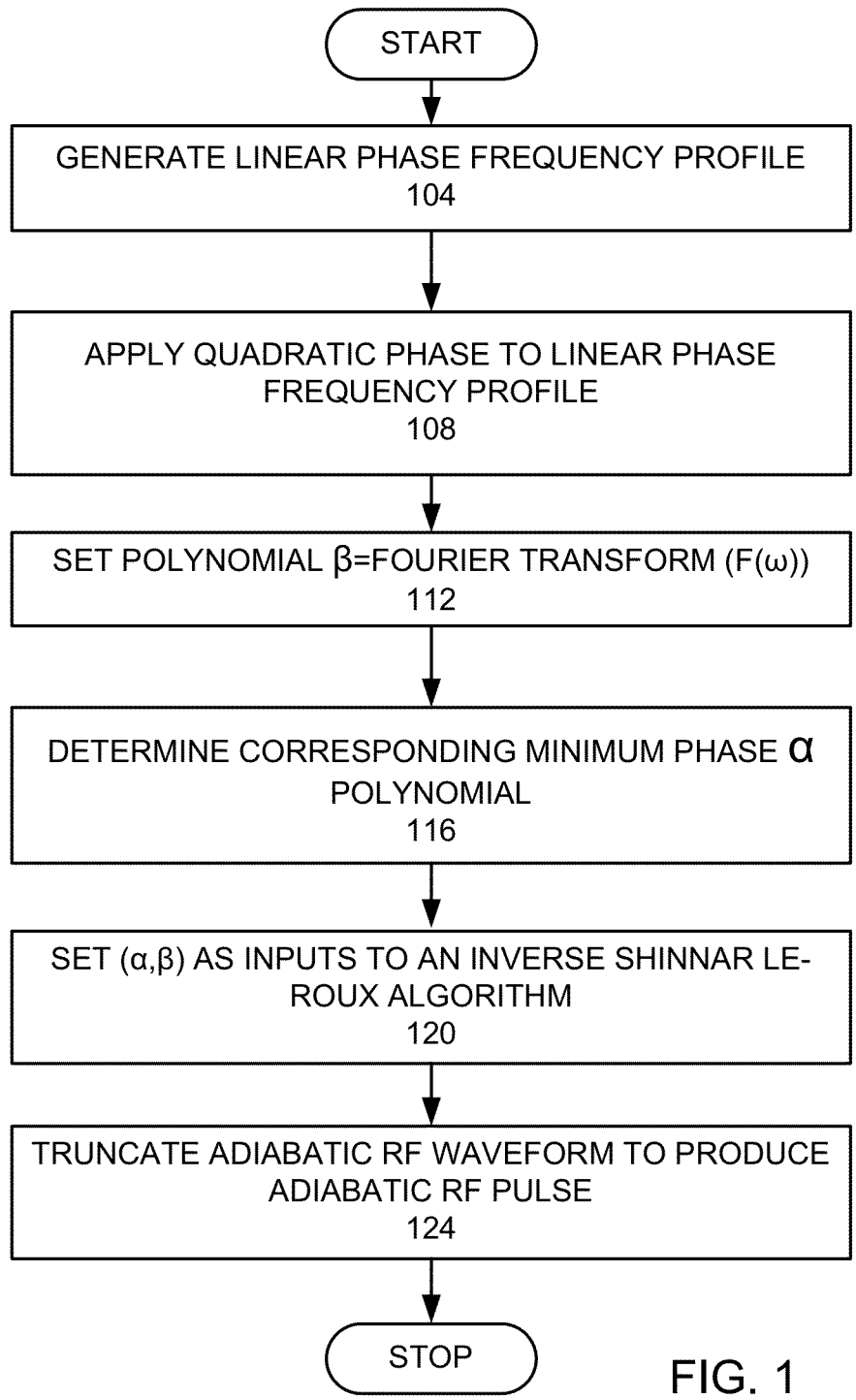
FIG. 1 is a high level flow chart of an embodiment of the invention.

In the specification and claims the phrase "adiabatic pulse" is defined as a pulse that is $B_1$ insensitive above a certain threshold.

Adiabatic pulses are a special class of RF pulses that may be used to achieve uniform flip angles in the presence of a nonuniform $B_1$ field. In this work, we present a new, systematic method for designing high-bandwidth, low-peak-amplitude adiabatic RF pulses that utilizes the Shinnar Le-Roux (SLR) algorithm for pulse design. The SLR algorithm is extensively employed to design non-adiabatic pulses for use in MR imaging and spectroscopy. We have adapted the SLR algorithm to create RF pulses that also satisfy the adiabatic condition. By overlaying sufficient quadratic phase across the spectral profile prior to the inverse SLR transform, we generated RF pulses that exhibit the required spectral characteristics as well as adiabatic behavior. Application of quadratic phase also distributes the RF energy more uniformly, making it possible to obtain the same spectral bandwidth with lower RF peak amplitude. The method enables the pulse designer to specify spectral profile parameters and the degree of quadratic phase prior to pulse generation. Simulations and phantom experiments demonstrate that RF pulses designed using this new method behave adiabatically.

Schulte R F, Tsao J, Boesiger P, Pruessmann K P., "Equi-ripple design of quadratic-phase RF pulses," J Magn Reson 2004; 166(1):111-122 describes a method for designing quadratic phase saturation pulses using the SLR transform. However, those pulses were optimized for equi-ripple behavior and not for adiabaticity.

Adiabatic pulses are a special class of RF pulses that provide $B_1$-insensitive rotation of the magnetization. They have been used extensively in MRI to provide immunity to the nonuniform $B_1$-fields generated by surface coils. They are also powerful replacements for standard RF pulses in pulse sequences used for high-field MR imaging and spectroscopy. $B_1$ inhomogeneity increases significantly at high field strengths, such as 7 Tesla (7 T), as the RF operating wavelength approaches the size of the human organ being imaged. Adiabatic pulses make it possible to gain some immunity to these $B_1$ variations. The degree of immunity is dependent on the percentage by which the amplitude of the pulse may be increased above the adiabatic threshold before reaching the limit of the RF coil/amplifier combination. Thus, when utilizing adiabatic pulses, particularly at high magnetic fields, low peak RF amplitude pulse designs are highly desirable.

Adiabatic pulses are amplitude and frequency modulated pulses that satisfy the adiabatic condition over the desired frequency band for the duration of the pulse. The most widely used adiabatic pulse design is the hyperbolic secant (HS) pulse which employs hyperbolic secant and hyperbolic tangent amplitude and frequency modulation functions, respectively. Several other amplitude and frequency modulated pulses have been proposed. Profile characteristics such as bandwidth (BW) and selectivity may be adjusted by changing certain parameters in the modulation functions that affect the modulation angular frequency, maximum $B_1$ field and truncation of the pulse. Care must be taken to adjust these parameters without violating the adiabatic condition. Pulses designed using numerically optimized modulation functions or modulation functions that satisfy offset-independent adiabaticity may be used to broaden the bandwidth of adiabatic pulses while minimizing the peak RF power. Gradient modulation may also be used to reduce the peak RF while maintaining adiabaticity.

In an embodiment of the invention, a new, systematic method for designing high-bandwidth, low-peak-amplitude adiabatic pulses by using the Shinnar Le-Roux (SLR) algorithm for pulse design is presented. The SLR algorithm, as described in Pauly J, Le Roux P, Nishimura D, Macovski A., "Parameter relations for the Shinnar-Le Roux selective excitation pulse design algorithm," IEEE Trans Med Imaging 1991; 10(1):53-65, which is incorporated by reference for all purposes, is extensively employed to design non-adiabatic pulses for use in MR imaging and spectroscopy sequences. An embodiment of the invention adapts the SLR algorithm to create RF pulses that also satisfy the adiabatic condition over the desired spectral profile. An interesting characteristic of adiabatic pulses is that they generate a spectral profile with quadratic phase. By overlaying sufficient quadratic phase across the spectral profile prior to the inverse SLR transform, an embodiment of the invention was able to generate RF pulses that exhibited the required spectral characteristics as well as adiabatic behavior.

Using an embodiment of the invention, it is possible for the user to specify the spectral profile characteristics (e.g. BW, fractional transition width) as well as the degree of quadratic phase prior to using the inverse SLR transform to generate the corresponding adiabatic RF pulse. The use of the SLR algorithm to produce non-adiabatic quadratic-phase RF pulses has been previously proposed. These pulses were designed to achieve high selectivity and broad bandwidths for use in saturation or inversion. However the pulses are not adiabatic. Pauly J, Nishimura D, Macovski A., "Quasi-adiabatic inversion pulses," In Proc., SMRM, 9th Annual Meeting, New York, 1990; 417, which is incorporated by reference for all purposes, discloses using the SLR transform to design quasi-adiabatic RF pulses that show some immunity to $B_1$ variations. In these techniques, quadratic phase was applied to the pulse to distribute the RF energy more equally, hence reducing peak RF amplitude. An embodiment of the invention employs quadratic phase in a similar manner to distribute RF energy, while maintaining adiabaticity. An embodiment of this invention is an improvement over the current designs that employ the SLR algorithm to generate quasi-adiabatic pulses because the parameter ranges and conditions applied during the algorithm produce a fully adiabatic pulse. This embodiment of the invention focuses on adiabatic full passage pulses (AFP) that may be used as inversion pulses or in pairs as refocusing pulses.

We define an adiabatic RF pulse as an RF pulse for which the generated magnetization profile varies less than 15% in the presence of $B_1$ amplitude variation of at least 100% above the adiabatic threshold. The adiabatic threshold is defined as the minimum $B_1$ value required to achieve the adiabatic condition.

Overview of Design Algorithm

The SLR algorithm reduces the problem of pulse design into that of designing two polynomials, α and β, which may be reversibly transformed to yield the RF pulse. The polynomials α and β may be represented by finite impulse response (FIR) filters and therefore may be generated using standard filter design algorithms. When designing the polynomials for a RF pulse, it is sufficient to first design a β polynomial with a frequency response that is equal to the desired spectral profile and then generate a matching minimum-phase a polynomial, which results in a minimum-energy RF pulse.

One property of adiabatic pulses is that they generate a spectral profile with quadratic phase. This is because the phase of the adiabatic RF pulse itself is a quadratic function, which produces a linear frequency sweep satisfying the adiabatic condition. It was unexpectedly found that when the β polynomial is set to be the Fourier transform (FT) of the response of a linear-phase FIR filter modulated with a properly chosen amount of quadratic phase which lies within a specified range, the inverse SLR transform yields an RF pulse that is remarkably adiabatic. Not all quadratic phase pulses are adiabatic. However, if quadratic phase is added such that the frequency sweep varies slowly enough to satisfy the adiabatic condition, the pulse can be made adiabatic. Characteristics of the spectral profile such as BW, transition width and ripple in the pass- and stop-bands are set as inputs to the FIR filter design algorithm, which in this embodiment, is a least-squares algorithm. Parks-McClellan algorithm could be used as well for the FIR filter design.

Pulse Design

FIG. 1 is a high level flow chart of an embodiment of the invention. The linear phase frequency profile is determined (step 104). In this embodiment of the invention, the linear phase component of the desired profile, F(ω), was found using the firls function in MATLAB (The Mathworks, Natick, Mass., USA). firls designs a linear-phase FIR filter that minimizes the weighted, integrated squared error between an ideal piecewise linear function and the magnitude response of the filter over a set of desired frequency bands. We begin by setting the sampling rate, $f_s$, in Hz for the filter. This value determines the sampling period of the pulse, ΔT, in s.

$$\Delta T = \frac{1}{f_s} \quad (1)$$

Similar to standard SLR pulse design, parameters, such as the ripple in the passband and stopband, normalized spectral BW and transition band width, are chosen and set as inputs to the firls function. An asymmetric profile may also be specified at this time. Equation 2 lists the vector inputs to the firls function, $$f_{FIR} = firls(N, F, A, W) \quad (2)$$
$$F = \frac{1}{\pi}[0 \quad \omega_p \quad \omega_s \quad \pi]$$
$$A = [1100]$$
$$W = [\delta_p \quad \delta_s]$$

where N is the number of samples. F is a vector of frequency band edges given in the range [0, π] but normalized to [0,1] with $\omega_p$ and $\omega_s$ denoting the passband and stopband edge angular frequencies. The vector A specifies the desired amplitude of the frequency response of the resultant filter and, in this case, is set for a lowpass filter. W contains the relative ripple amplitudes in the pass- and stopbands given by $\delta_p$ and $\delta_s$, respectively. $\omega_p$ and $\omega_s$ must be chosen so that the required spectral selectivity is achieved while keeping ripple in the passband and stopband within set limits.

The normalized spectral BW for the pulse is given by $$BW = \frac{\omega_p + \omega_s}{2} \quad (3)$$

and the fractional transition width is $$FTW = \frac{\omega_s - \omega_p}{\omega_s + \omega_p} \quad (4)$$

The physical spectral bandwidth in Hz, $\hat{BW}$ $$\hat{BW} = \frac{BW \cdot f_s}{\pi} \quad (5)$$

The FIR filter produced by the firls function is zero padded to $N_{total}$ samples and the inverse Fourier transform is taken to yield the linear phase spectral profile, $F_{lp}(\omega)$. Zero padding is performed in order to increase the sampling resolution of $F_{lp}(\omega)$.

$$F_{lp}(\omega) = F(f_{FIR}) \quad (6)$$

A quadratic phase is applied to the linear phase frequency profile (step 108). In this embodiment, quadratic phase is overlaid on the linear phase spectral profile as given in Equation 7, to obtain the final F(ω). The constant, k, determines the number of cycles of quadratic phase that are applied across the spectral profile.

$$F(\omega) = F_{lp} \cdot e^{ik\omega^2} \quad (7)$$

The optimal value of k depends on width of the transition bands of $F_{lp}(\omega)$. The value of k determines the amount of quadratic phase that is applied and therefore the degree by which the RF energy is uniformly distributed over the pulse.

We found that a k value that satisfies Equation 8 results in sufficient phase applied across the transition bands of the spectral profile. A k value that is significantly below this limit results in the distortion of transition bands at low $B_1$ values, thus reducing the $B_1$ range over which the pulse behaves adiabatically.

Equation 8 provides an approximate lower limit for k and it is recommended that a few design iterations during the simulation stage be performed to arrive at the optimal k value for a chosen set of parameters.

$$k > \frac{0.03\pi(N+1)}{\omega_s - \omega_p} \quad (8)$$

To further ensure an adiabatic pulse, more preferably $$k > \frac{0.1\pi(N+1)}{\omega_s - \omega_p}.$$

The FIR filter given in Eqn. 2 is of length N+1. If no quadratic phase were applied, the resultant linear phase SLR pulse would be of duration (N+1)ΔT. The duration of the pulse is inversely related to the effective transition width.

A polynomial β is given by the Fourier transform of the spectral profile (step 112):

$$\beta = F(F(\omega)) \quad (9)$$

A matching minimum-phase α polynomial is then calculated for the β(step 116). Once α and β are specified, an RF waveform is found by applying the inverse SLR transform (step 120).

$$B_1(t) \xleftrightarrow{SLR} (\alpha, \beta) \quad (10)$$

The adiabatic RF waveform is truncated to produce an adiabatic RF pulse (step 124). In this embodiment, the pulse is truncated to the number of samples, $N_{pulse}$, chosen such that $$B_1(N_{pulse} \cdot \Delta T) > 0.25 \cdot B_{1,peak} \quad (11)$$

To ensure a smooth profile for the adiabatic pulse, more preferably $B_1(N_{pulse} \cdot \Delta T) > 0.05 \cdot B_{1,peak}$, where $B_{1,peak}$ is the peak amplitude of the RF waveform. That is, the $B_1$ amplitude at the end of the pulse should be less than 25% of the peak $B_1$ value. Our simulations showed that truncating the pulse to a duration that is smaller than this value significantly degrades the adiabatic behavior. The pulse needs to be truncated because the final duration of the pulse, or equivalently the portion of the waveform generated by Eqn. 10 over which the RF energy is spread, is determined by the amount of applied quadratic phase. The final pulse duration, T, is $$T = N_{pulse} \cdot \Delta T \quad (12)$$

Simulations

An example adiabatic pulse was designed to validate the method outlined above. The pulse was designed to have a physical spectral bandwidth of 9.8 kHz, pulse duration of 12 ms and FTW of 0.21. $f_s$ was set to 119 kHz. Values used as inputs for the firls function are given in Eqn. 13.

$$f_{FIR} = \text{firls}(N, F, A, W) \quad (13)$$
$$N = 255$$
$$F = \frac{1}{\pi}[0\ 0.065\pi\ 0.1\pi\ \pi]$$
$$A = [1\ 1\ 0\ 0]$$
$$W = [1\ 0.01]$$

Figure 2:
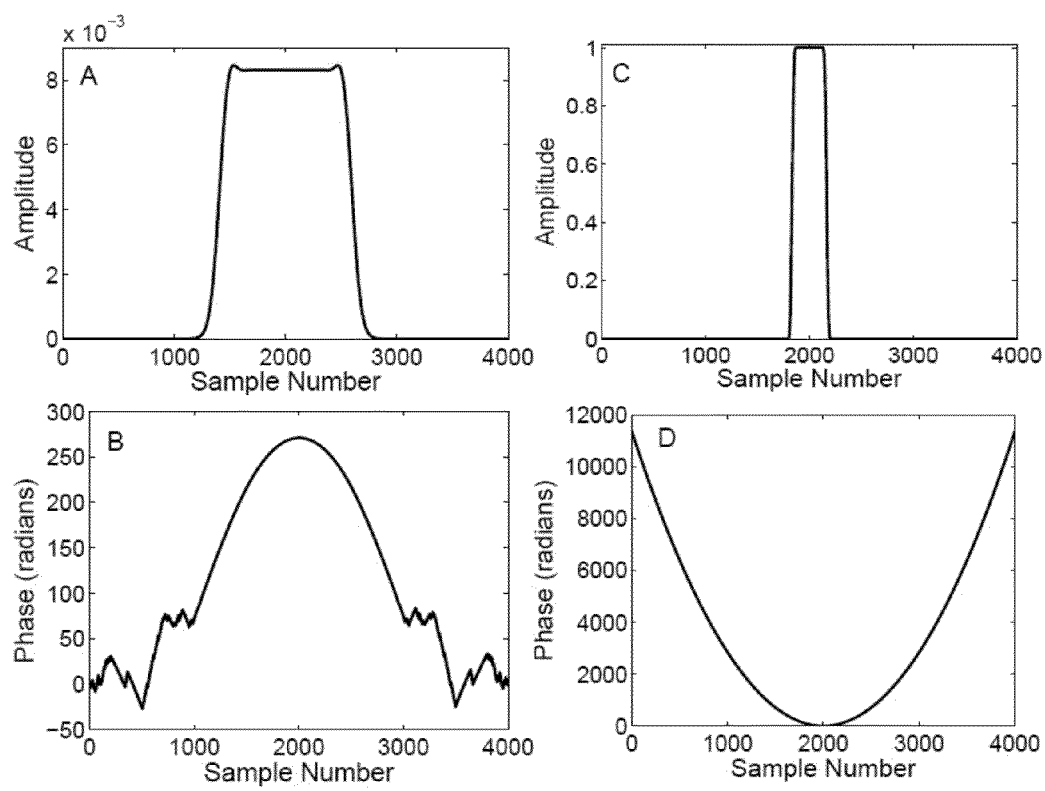
FIGS. 2A and B are plots of the amplitude and phase of the resultant $\beta$ polynomial created by overlaying quadratic phase on a filter that is output by the firls function.
FIGS. 2C and D show the amplitude and phase of the Fourier transform of the $\beta$ polynomial.

We zero padded the output of the firls function to have $N_{total}$=4000 samples in total. A k value of 1150 was used and the RF waveform was truncated to 12 ms. FIGS. 2A and B are plots of the amplitude and phase of the resultant β polynomial created by overlaying quadratic phase on a filter that is output by the firls function, where FIG. 2A is a graph of the magnitude and FIG. 2B is a graph of the phase. The amplitude and phase of the Fourier transform of the β polynomial are shown in FIGS. 2C and D. FIG. 2C shows a desired spectral profile for the resultant RF pulse. The magnitude, phase and frequency waveforms for the adiabatic SLR pulse are shown in FIGS. 3A-C with optimal quadratic phase and spectral BW of 9.8 kHz. The peak amplitude of the pulse is 17.2 µT. Frequency varies approximately linearly at a rate that satisfies the adiabatic condition for the duration of the pulse.

Simulations were performed in MATLAB by explicitly multiplying the rotation matrices to obtain the spectral profile of the pulse. $T_1$ and $T_2$ effects were neglected. The refocusing and inversion profile were simulated for the exemplary RF pulse shown in FIGS. 3A-C. The magnitude and phase of the refocusing profile and the magnitude of the inversion profile were plotted. The refocusing profile is the spectral profile that is multiplied by the transverse magnetization if the pulse is used as a refocusing pulse with crusher gradients to produce a spin echo. The inversion profile is the spectral profile of the longitudinal magnetization if the pulse is used as an inversion pulse. Wherever unspecified, the simulated spectral profile is the refocusing profile.

To study the effects of varying the applied quadratic phase, RF pulses were generated using the inputs in Equation 13 for k values ranging from 450 to 1400. Spectral profiles for a range of $B_1$ overdrive factors above adiabatic threshold were simulated for each pulse and compared. The $B_1$ overdrive factor is equal to the amplitude at which we operate the pulse divided by the amplitude of the pulse at adiabatic threshold. Therefore, a $B_1$ overdrive factor of 1.5 would mean a 50% increase of pulse amplitude above the adiabatic threshold.

The RF waveform produced using a k value of 1150 was truncated to three different pulse durations (14 ms, 11.7 ms and 9 ms). Spectral profiles for the three pulses were generated for a range of $B_1$ overdrive factors and adiabaticity was compared.

A hyperbolic secant and adiabatic SLR pulse with the same physical spectral bandwidth were generated and the peak RF amplitudes of the pulses were compared.

Phantom Experiments

Figure 4:
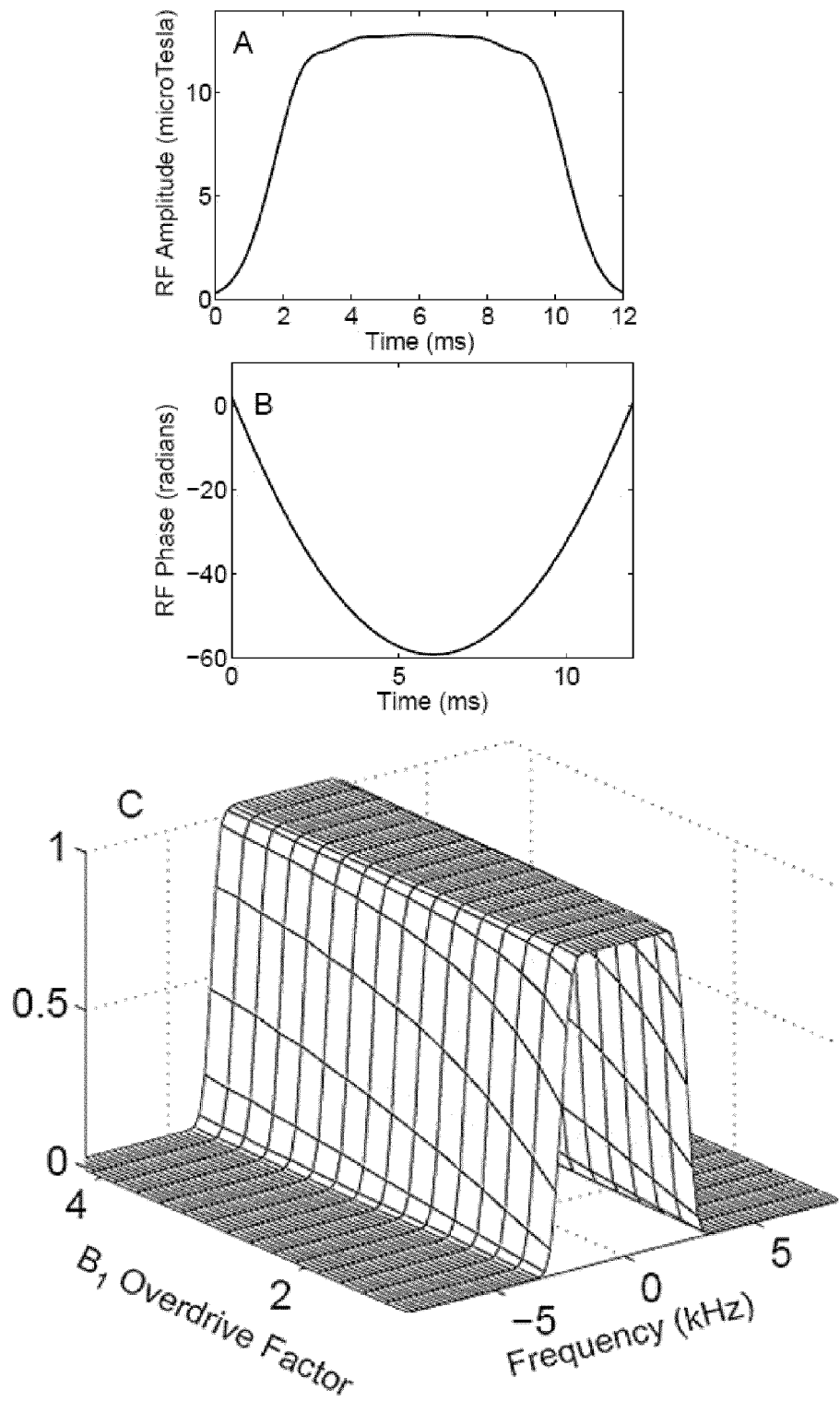
FIGS. 4A, B and C, which show the magnitude and phase of the adiabatic SLR pulse used for a phantom experiment and which show the spectral profile of the pulse for a range of $B_1$ overdrive factors.

Phantom experiments were conducted using a standard transmit/receive birdcage head coil at 3 T (Whole-body magnet; GE Healthcare, Waukesha, Wis., USA) to validate the pulse performance. Since we were limited by the maximum output of our RF coil/amplifier combination, we used a pulse designed to have a smaller physical spectral bandwidth of 5 kHz and consequently reduced peak RF amplitude of 12.8 µT. This way it was possible to overdrive the pulse in order to check a larger range of adiabatic behavior and better illustrate the pulse performance experimentally. The k value used was 2000. The amplitude and phase waveforms for this pulse and the simulated spectral profile for a range of $B_1$ values are given in FIGS. 4A, B and C, which show the magnitude (FIG. 4A) and phase (FIG. 4B) of the adiabatic SLR pulse used for the phantom experiment and which show the spectral profile (FIG. 4C) of the pulse for a range of $B_1$ overdrive factors.

Figure 5:
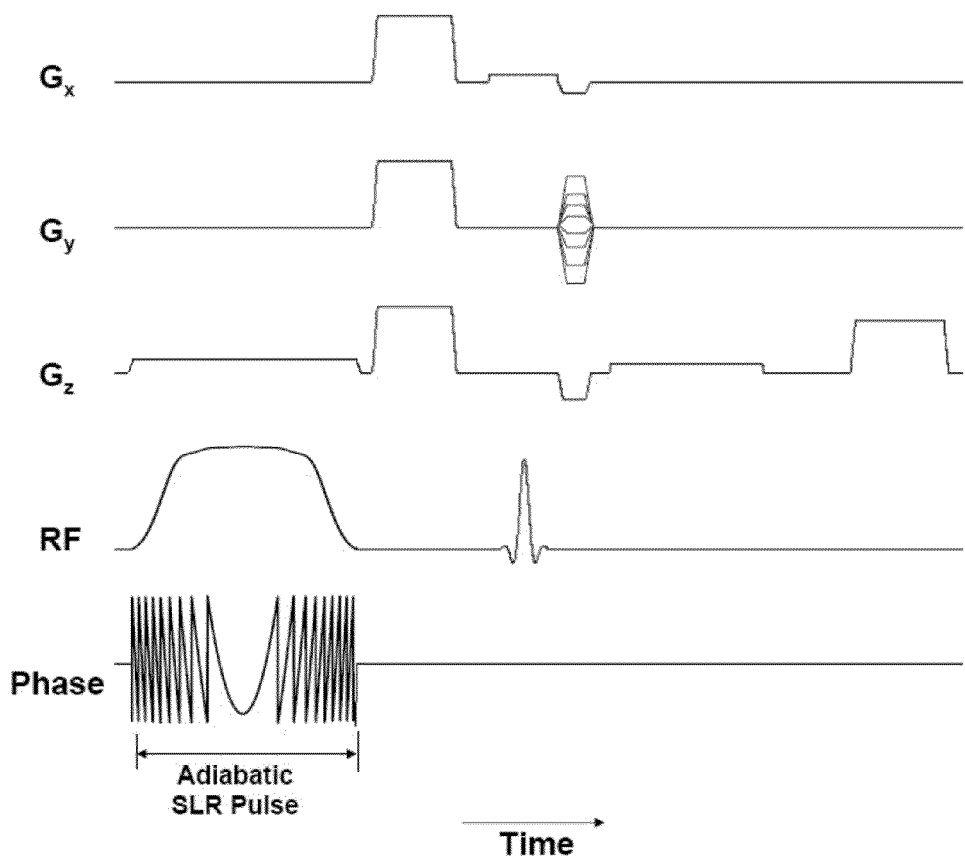
FIG. 5 shows a final pulse sequence.

The pulse was added to a standard GRE sequence as an inversion pulse prior to the 90° excitation pulse. The final pulse sequence is shown in FIG. 5, which shows the RF, phase and gradient waveforms for the pulse sequence, which uses the adiabatic SLR pulse for inversion. The inversion pulse is selective in the z dimension, the 90° excitation pulse is selective in the x direction, the readout gradient is applied in the z dimension, and the phase encodes are applied in the y dimension. The image is acquired with the inversion pulse turned on and subtracted from an image acquired with the inversion pulse turned off. In the subtracted image, the inverted slice will appear bright and all other signals will be suppressed.

Figure 6A:
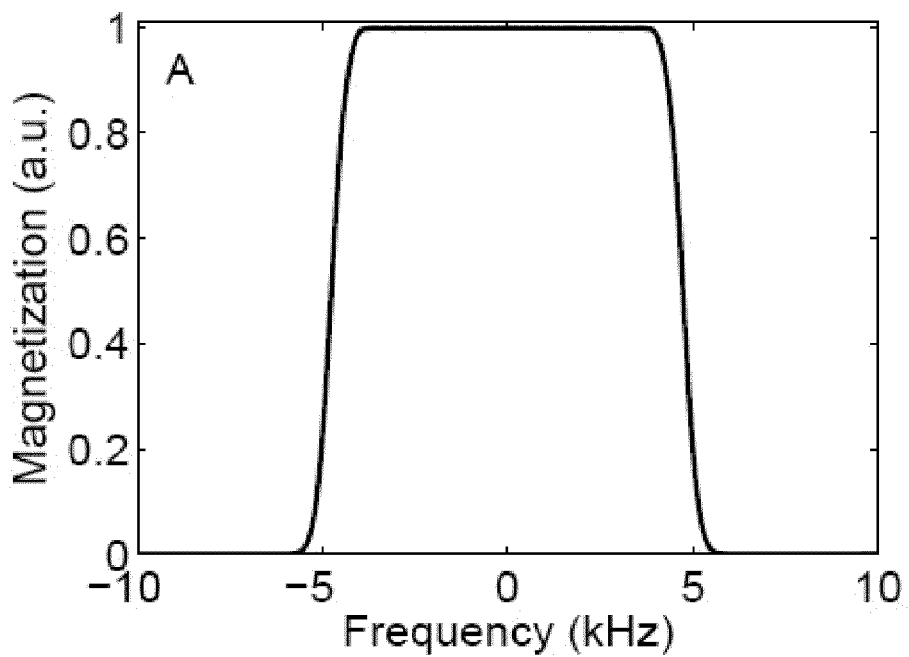
FIGS. 6A and B show the magnitude and phase of the simulated spectral profile for the adiabatic SLR pulse in FIG. 3 when the $B_1$ is set to 10% above the nominal value and when the pulse is used as a refocusing pulse.
Figure 6B:
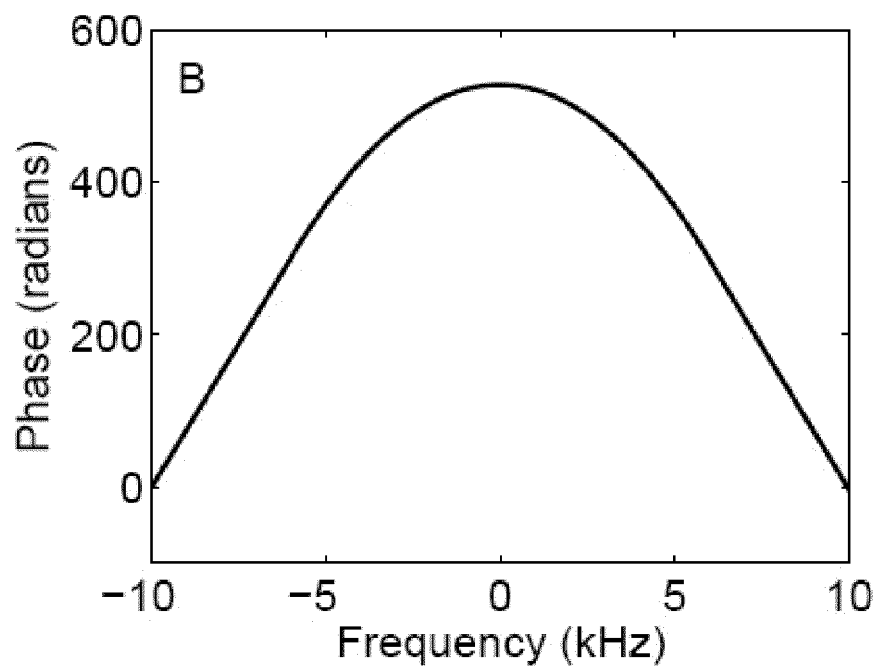
FIG. 6C shows a log plot of the spectral profile.
FIG. 6D shows the inversion profile when the pulse is used for inversion of magnetization.
Figure 6C:
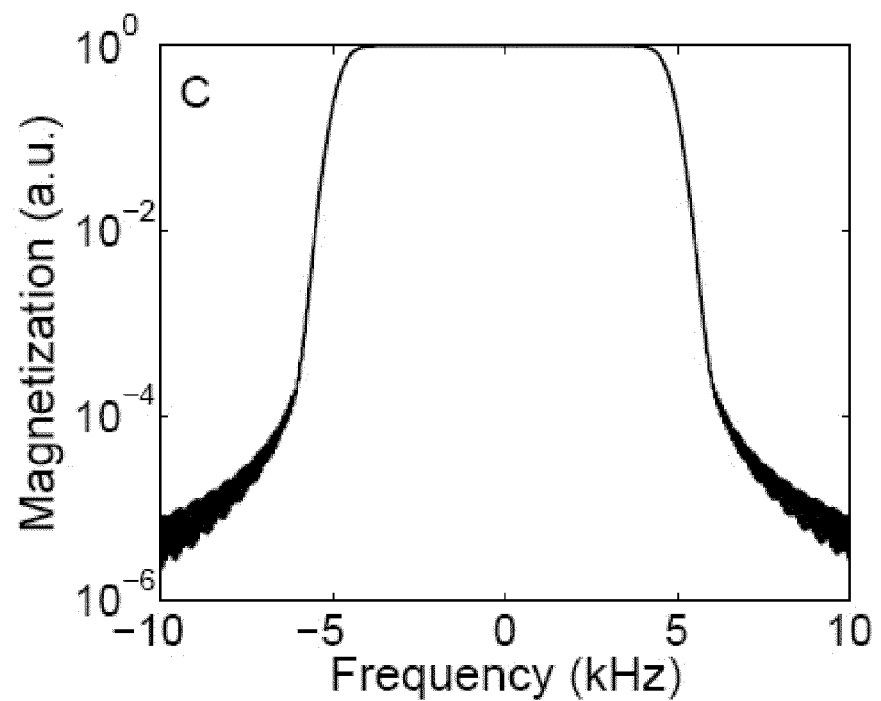
Figure 6D:
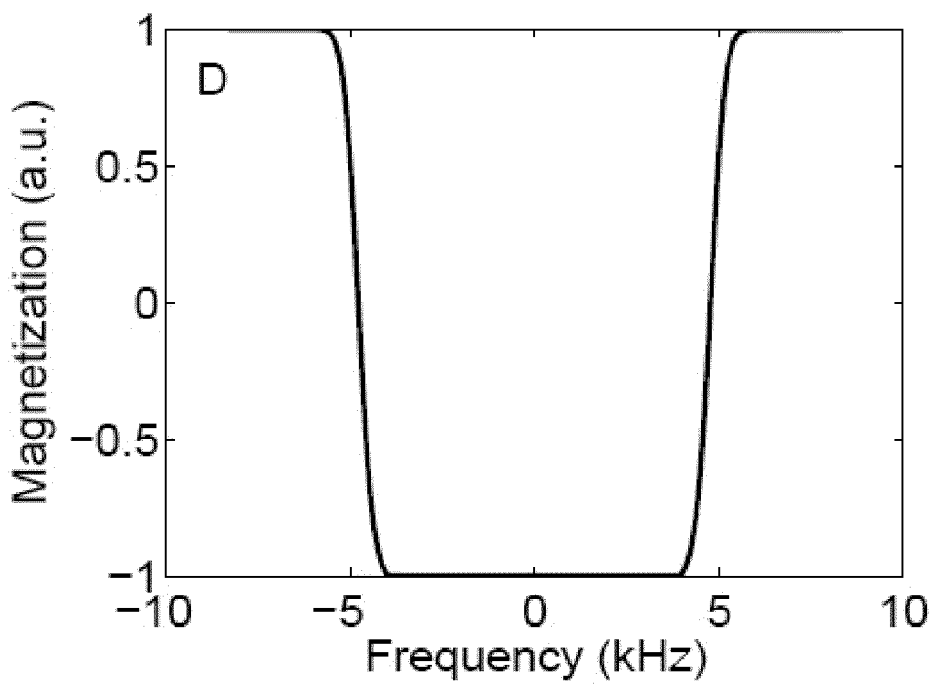

A slice-selective gradient was played in conjunction with the pulse to invert a 14 mm slice. Frequency and phase encoding dimensions for the GRE sequence were both set to be orthogonal to the excited slice in order to provide an image of the inversion slice profile. A spherical water phantom was imaged. Several images were obtained with the inversion pulse amplitude set to the nominal $B_1$ (at approximately the adiabatic threshold) and at 25%, 50%, 75%, and 100% above the nominal $B_1$ value. These were subtracted from an image obtained without the adiabatic inversion pulse. Acquisition parameters were: TE/TR=9/5500 ms, matrix size=256×128, FOV=24×24 cm and scan time=11:44 min. Since the objective was to measure the inversion profile for the pulse, a long repetition time (TR) of 5500 ms was used in order allow for full $T_1$ relaxation between pulse applications so that the signal-to-noise ratio of the measurement could be maximized Simulation Results FIGS. 6A and B show the magnitude and phase of the magnetization profile for the adiabatic SLR pulse in FIG. 3, when used as a refocusing pulse. $B_1$ is set to 10% above the adiabatic threshold. As expected, the phase of the spectral profile is quadratic. The log plot of the spectral profile is shown in FIG. 6C. The inversion profile for the pulse is shown in FIG. 6D.

Figure 3:
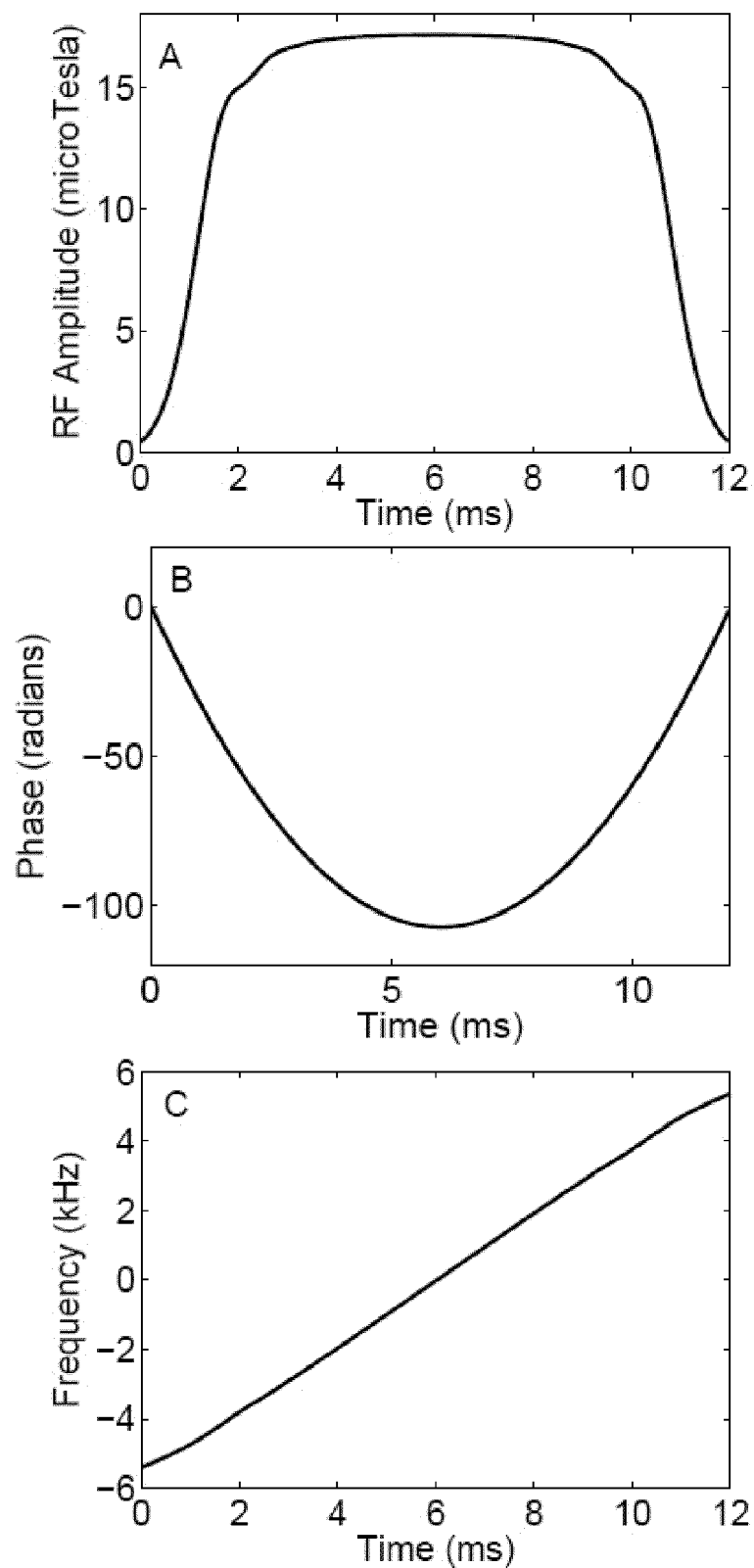
FIGS. 3A-C show the magnitude, phase, and frequency waveforms for the adiabatic SLR pulse.
Figure 7:
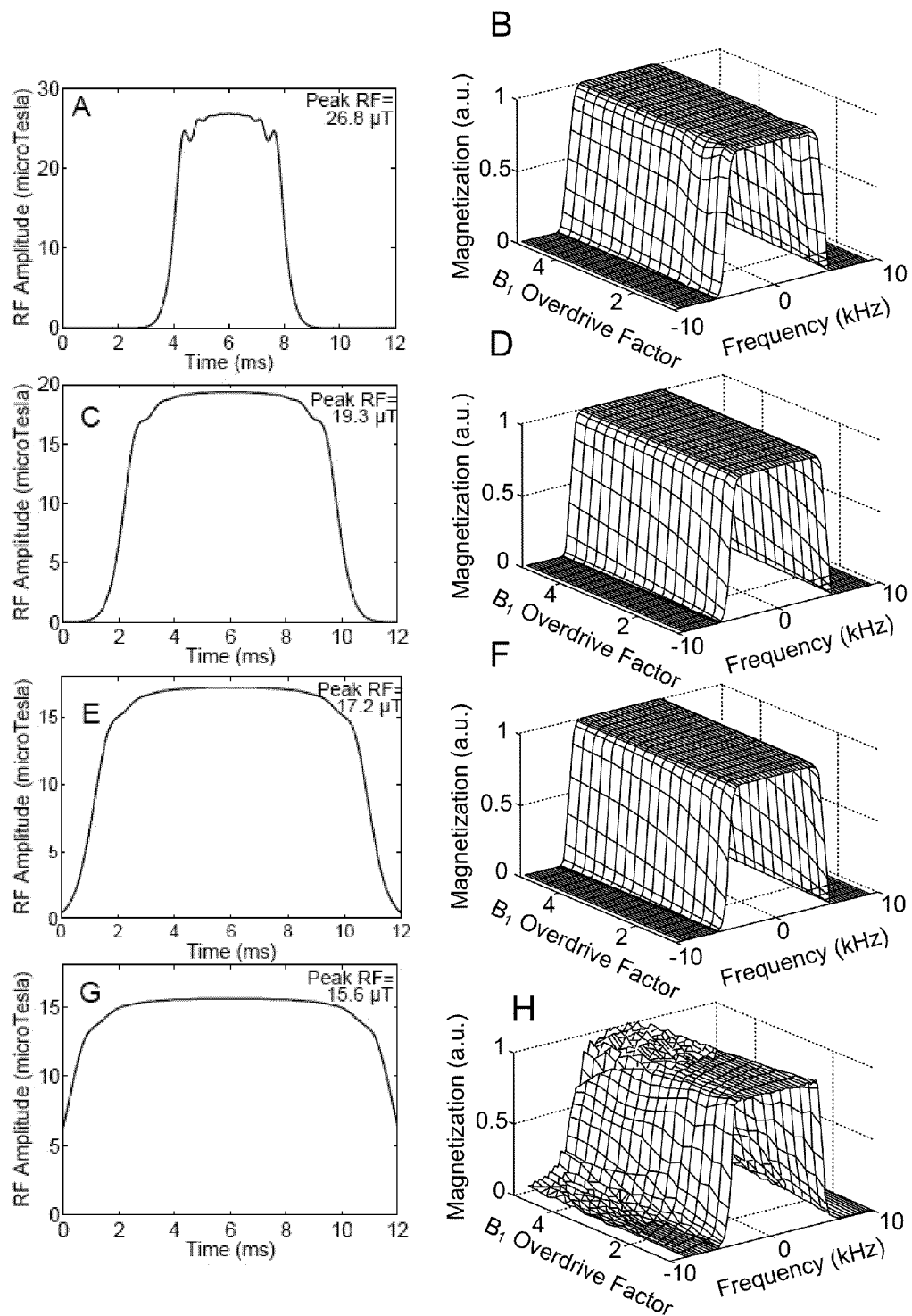
FIGS. 7A-H show RF pulse shape and adiabatic behavior for different amounts of applied quadratic phase (i.e., k values).
Figure 9:
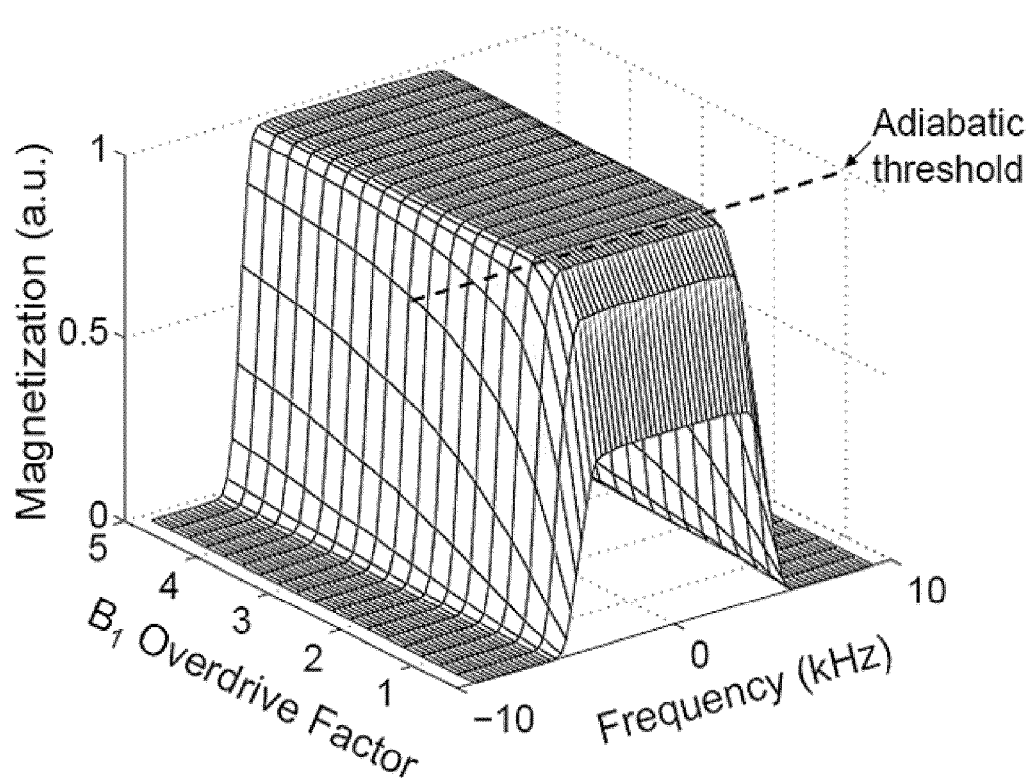
FIG. 9 shows the simulated spectral profile of the adiabatic SLR pulse as the $B_1$ value decreases below the adiabatic threshold.

FIGS. 7A-H show RF pulse shape and adiabatic behavior for different amounts of applied quadratic phase (i.e. k values). The amplitude waveforms of the adiabatic RF pulses generated using a k value of 450, 900, 1150 and 1400 are shown in FIGS. 7A, C, E, and G, respectively. Simulated spectral profiles over a range of $B_1$ values were simulated for each pulse and are shown in FIGS. 7B, D, F and H. As the k value reduces below 900, distortion in the transition bands at low $B_1$ values increases proportionately. For a pulse duration of 12 ms, if a k value of 1400 is used (FIGS. 7G and H), the RF pulse is significantly truncated and the profile at all values of $B_1$ degrades. At adiabatic threshold, the ripple in the stop- and passbands is similar to that of a standard least squares SLR pulse designed using the vector inputs in Eqn. 13. For all k values, there is some increase in the width of the transition band and reduction in passband ripple as $B_1$ increases. RF energy is more uniformly distributed as the k value is increased, resulting in a reduced RF peak amplitude. A k value of 1150 resulted in optimal RF distribution, adiabaticity and spectral profile integrity. The corresponding RF pulse is shown in FIG. 3. The behavior of the spectral profile for this pulse when the pulse amplitude is set below the adiabatic threshold is shown in FIG. 9. Since the pulse duration is set to 12 ms, the RF pulse is truncated and the spectral profile is degraded at k values above 1150.

Figure 8:
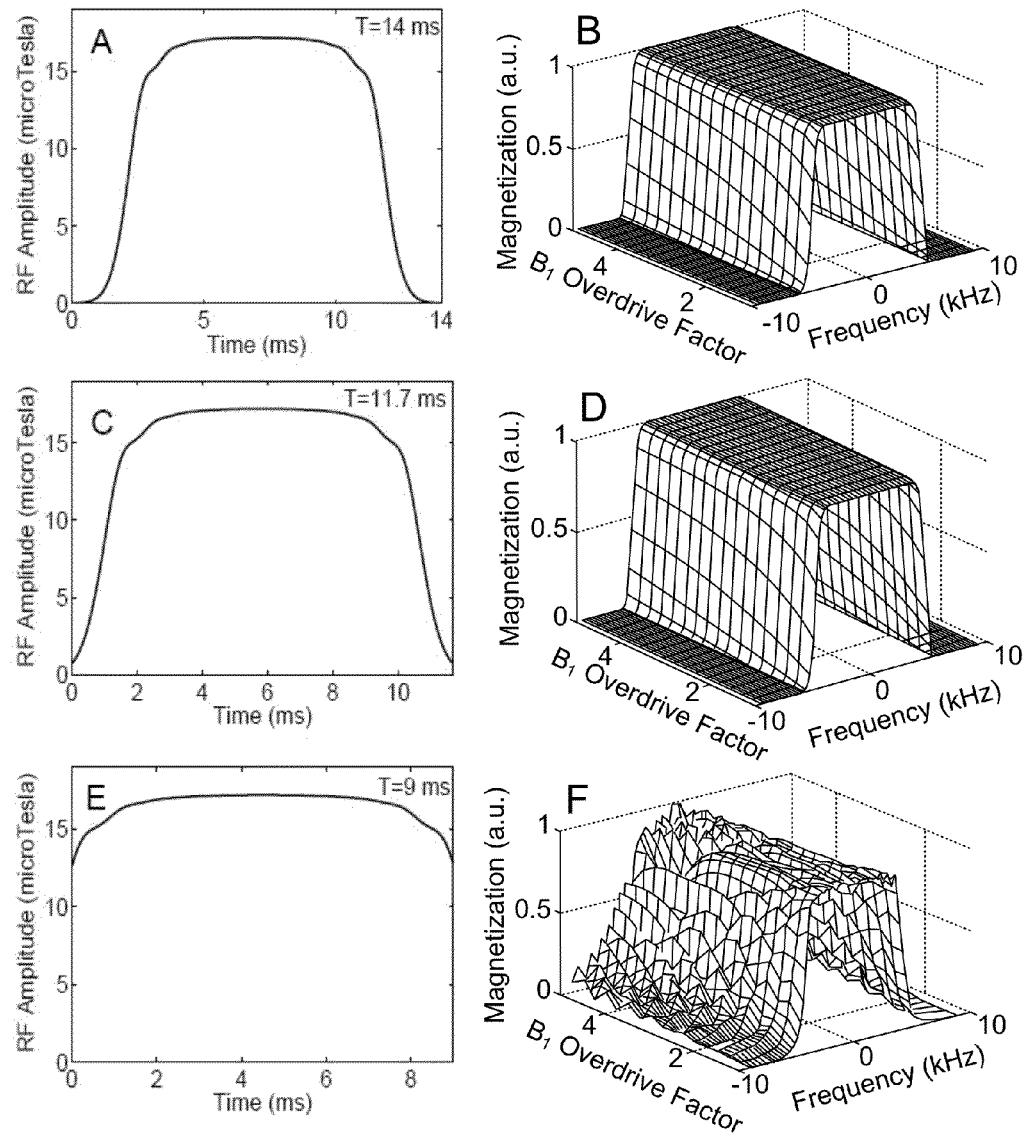
FIGS. 8A-F show adiabatic behavior for adiabatic SLR pulses that have been truncated to different pulse durations.

FIGS. 8A-F show adiabatic behavior for adiabatic SLR pulses that have been truncated to different pulse durations. The amplitude waveforms and corresponding spectral profiles versus $B_1$ overdrive factor are shown for adiabatic SLR pulses when the pulse is truncated. RF pulses resulting from truncating the RF waveform generated using a k value of 1150 to a duration of 14 ms, 11.7 ms and 9 ms are shown in FIGS. 8A, C and E, respectively. The corresponding simulated spectral profiles for a range of $B_1$ values are shown in FIGS. 8B, D and F. All three pulses have the same peak $B_1$ amplitude. At a pulse duration of 11.7 ms, truncation occurred when the $B_1$ amplitude reached 5% of the peak $B_1$ value. Setting the pulse to a shorter duration creates distortion of the spectral profile and degrades adiabatic behavior as is seen for the 9 ms pulse in FIG. 8F. Therefore in this embodiment it is preferable that truncation occurs when $B_1$ amplitude is no more than 25% of the peak $B_1$ value. This is done by setting $k<k_{max}$, where $k_{max}$ is a value at which the adiabatic RF pulse is truncated at 25% of a maximum RF amplitude. More preferably truncation occurs when $B_1$ amplitude is no more than 5% of the peak $B_1$ value. This is done by setting $k<k_{max}$, where $k_{max}$ is a value at which the adiabatic RF pulse is truncated at 5% of a maximum RF amplitude.

Figure 10:
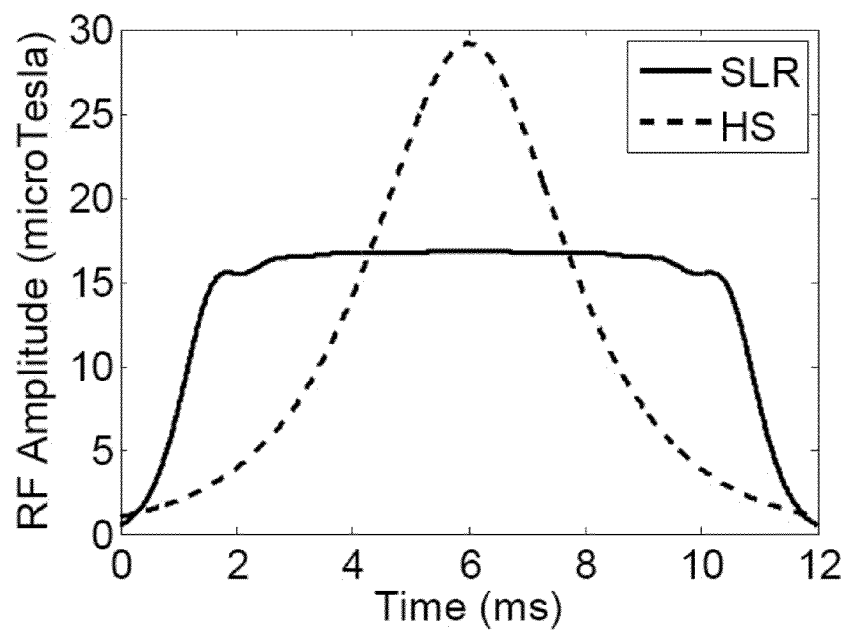
FIG. 10 shows the radio frequency (RF) peak amplitude of a hyperbolic secant (HS) pulse and a comparative adiabatic Shinnar Le-Roux (SLR) pulse with a similar bandwidth.

Comparative HS and adiabatic SLR pulses are shown in FIG. 10. Both pulses have a physical spectral BW of 9.8 kHz. However, the RF peak amplitude of the HS pulse is 74% greater than the comparative adiabatic SLR pulse. Note that, although the adiabatic SLR pulse shown in FIG. 10 was designed to generate a profile with thinner transition bands than the pulse in FIG. 3, the HS pulse still achieves a spectral profile with thinner transition band widths. Specific absorption rate (SAR) values for the two pulses are similar.

Phantom Results

Figure 11:
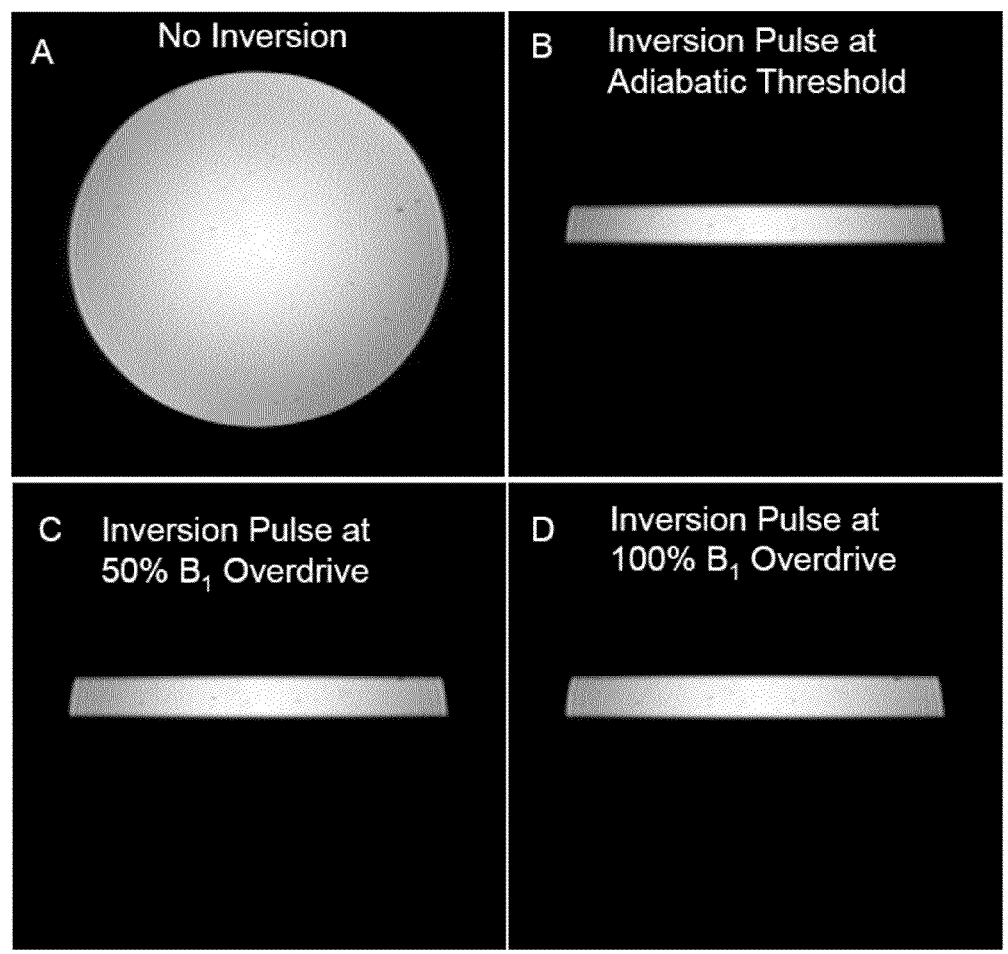
FIGS. 11A-D show results obtained from a spherical agar phantom at 3 T using the pulse sequence of FIG. 5.
Figure 12:
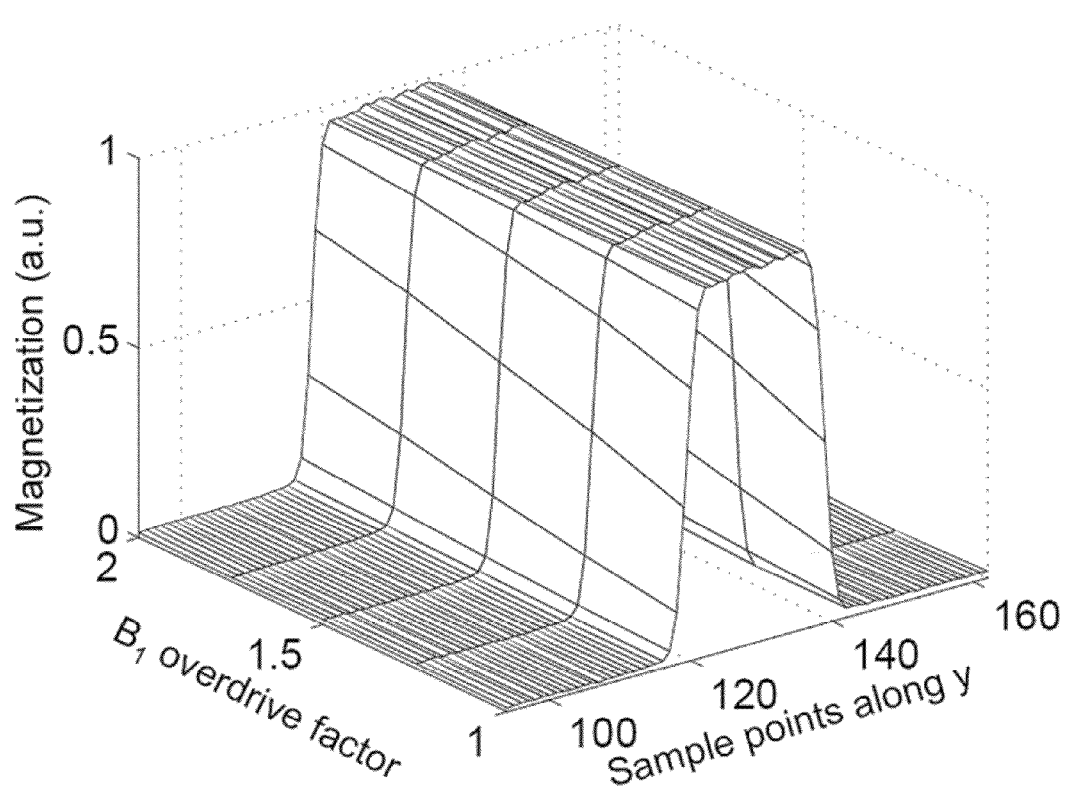
FIG. 12 shows vertical cross-sections of phantom images of inverted slice through the center of all images obtained plotted against $B_1$ value of an adiabatic SLR inversion pulse.

FIGS. 11A-D show results obtained from a spherical agar phantom at 3 T using the pulse sequence of FIG. 5. FIG. 11A shows a phantom image magnitude for an acquisition without the inversion pulse. FIG. 11B shows a phantom image magnitude for an acquisition with the inversion pulse at adiabatic threshold subtracted from the image in FIG. 11A. FIG. 11C shows a phantom image magnitude for an acquisition with the inversion pulse at 50% above adiabatic threshold subtracted from the image in FIG. 11A. FIG. 11D shows a phantom image magnitude for an acquisition with the inversion pulse at 100% above the adiabatic threshold subtracted from the image in FIG. 11A. All images are windowed equivalently. Intensity of the inverted band is $B_1$ independent. Vertical cross-sections of phantom images of inverted slice through the center of all images obtained are plotted against $B_1$ value of an adiabatic SLR inversion pulse is shown in FIG. 12. Profiles are largely invariant for different values of $B_1$, illustrating adiabatic behavior.

Discussion

These embodiments of the invention, provide a method that uses the SLR transform to generate adiabatic pulses. Simulations and phantom experiments demonstrate that the pulses generated using this embodiment of the invention behave adiabatically. This embodiment of the invention enables the pulse designer to specify the spectral profile characteristics (e.g. BW, fractional transition width) as well as the degree of quadratic phase prior to using the inverse SLR transform to generate the corresponding adiabatic RF pulse. Increasing the degree of quadratic phase distributes RF energy more evenly, resulting in a lower RF peak amplitude.

The method requires calculation of the α and β polynomials for the pulse. Once these polynomials are available, it is possible to design a matched 90° pulse or an adiabatic self-refocused pulse as the polynomials that describe these pulses are functions of those used to generate the original adiabatic 180° pulse. However, further investigation on how to retain phase-refocusing for the final spin echo as $B_1$ is varied is still required. These pulses may also be divided into adiabatic half passage segments and used to compose a BIR-4 pulse for $B_1$-independent rotation.

The quadratic phase applied to the spectral profile of the pulses under an embodiment of the invention was generated by taking the square of a linear frequency sweep. Different functions were tested for the frequency sweep, including a hyperbolic tangent variation, but did not find a significant advantage. Other embodiments may provide continued optimization of the applied quadratic phase function.

The peak $B_1$ and time-bandwidth product (TBW) of the adiabatic SLR pulse are related to the peak $B_1$ and TBW product of the linear phase SLR pulse generated by the FIR filter if no quadratic phase were applied. Using this algorithm, once the physical spectral BW is set, the initial values for peak $B_1$ and T are those of the linear phase SLR pulse. The application of quadratic phase increases the pulse duration and decreases the peak $B_1$ value. The physical spectral bandwidth as well as the selectivity of the profile remain the same. We found that the factor by which the peak $B_1$ changes is approximately inversely proportional to the square root of the factor by which k is increased. Future work will be focused on establishing the exact relationship between the k value used and the increase in pulse duration.

Context of Use of Invention

Figure 13:
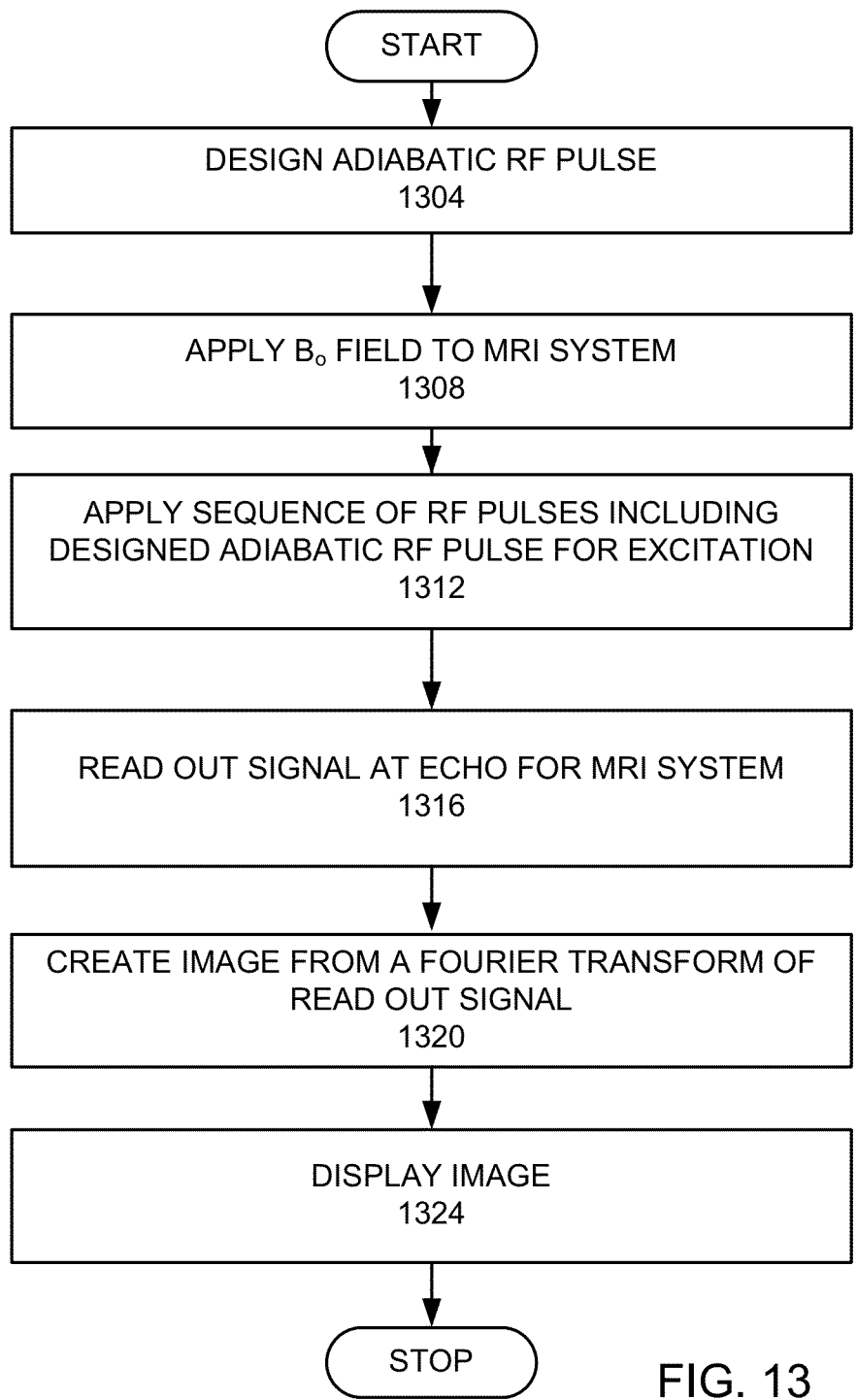
FIG. 13 is a high level flow chart of a generalized application of an embodiment of the invention, which helps to provide context for the invention.

FIG. 13 is a high level flow chart of a generalized application of an embodiment of the invention, which helps to provide context for the invention. An adiabatic RF pulse that is an inversion or refocusing pulse for a RF pulse sequence, for a magnetic resonance imaging system is designed (step 1304). The above embodiments may be used to design the adiabatic RF pulse.

Figure 14:
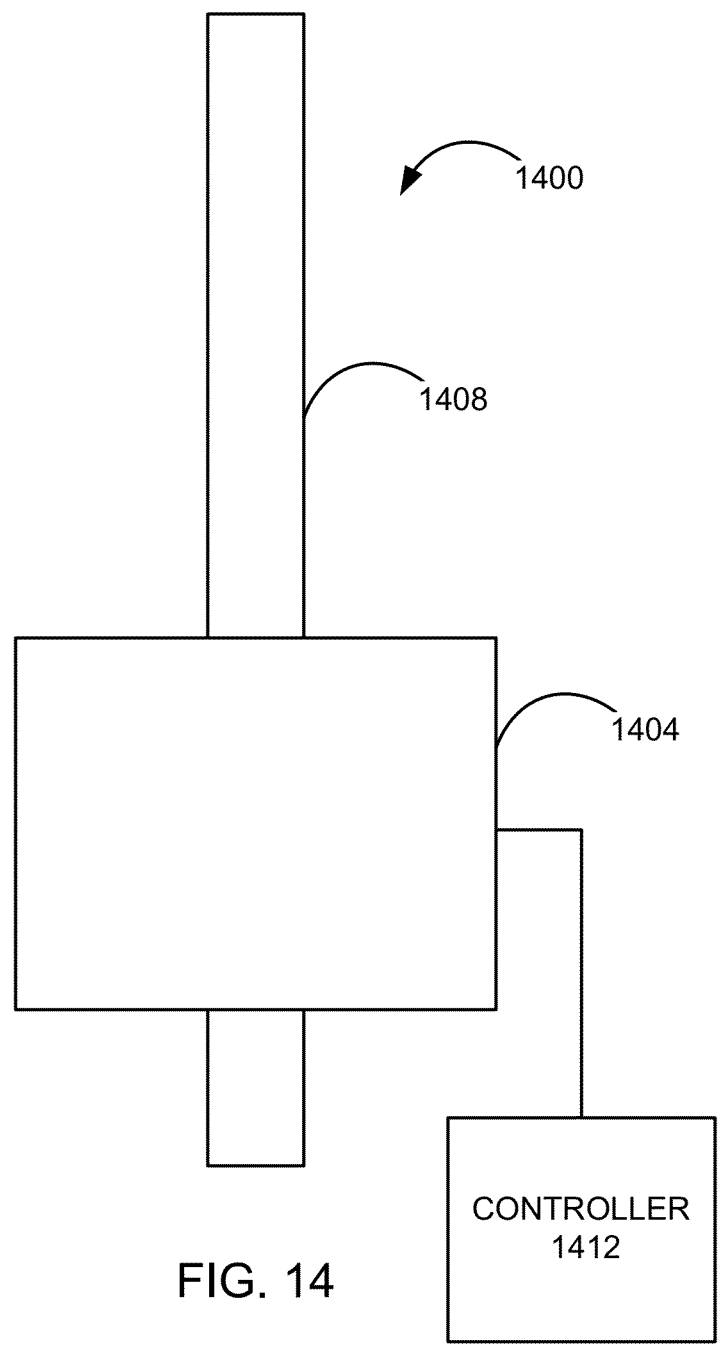
FIG. 14 is a schematic top view of a magnetic resonance imaging (MRI) system.

FIG. 14 is a schematic top view of a magnetic resonance imaging (MRI) system 1400 that may be used in an embodiment of the invention. The MRI system 1400 comprises a magnet system 1404, a patient transport table 1408 connected to the magnet system, and a controller 1412 controllably connected to the magnet system. In one example, a patient would lie on the patient transport table 1408 and the magnet system 1404 would pass around the patient. The controller 1412 would control magnetic fields and radio frequency (RF) signals provided by the magnet system 1404 and would receive signals from detectors in the magnet system 1404.

Figure 15A:
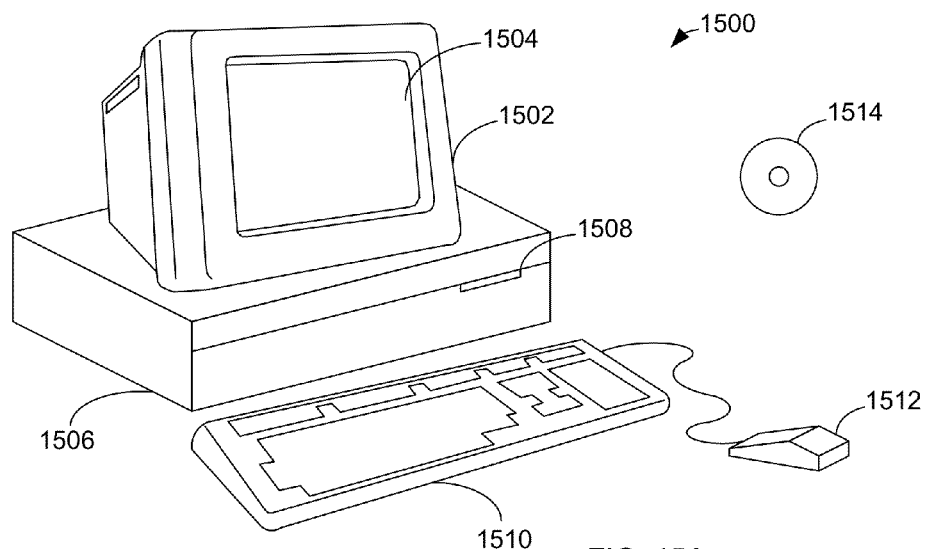
FIGS. 15A and 15B illustrate a computer system, which is suitable for implementing a controller used in embodiments of the present invention.
Figure 15B:
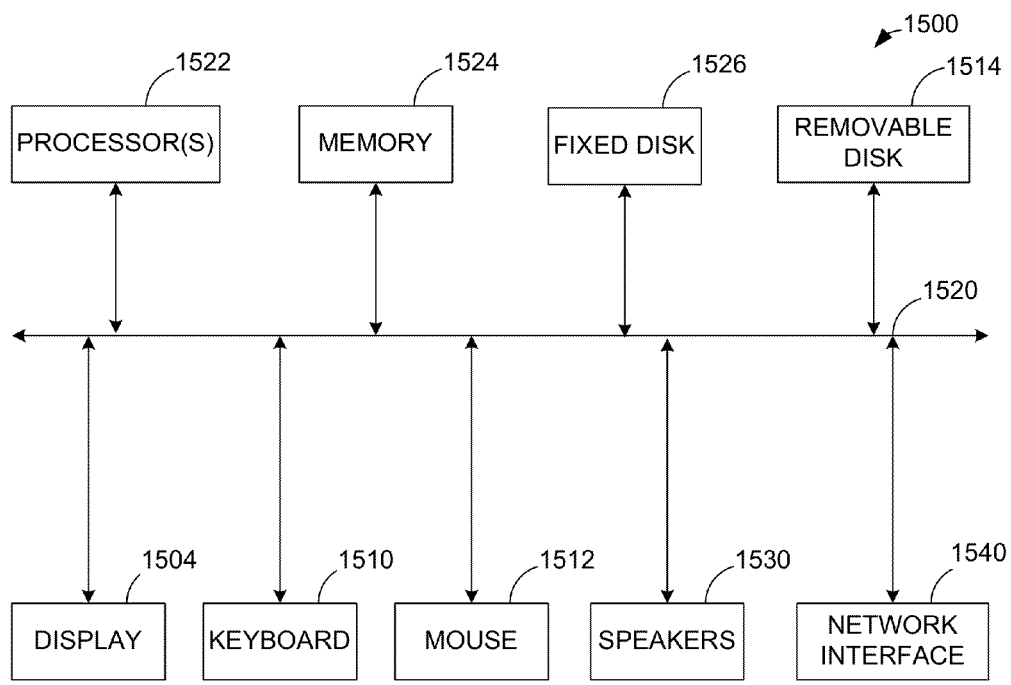

FIGS. 15A and 15B illustrate a computer system 1500, which is suitable for implementing a controller 1412 used in embodiments of the present invention. FIG. 15A shows one possible physical form of the computer system. Of course, the computer system may have many physical forms ranging from an integrated circuit, a printed circuit board, and a small handheld device up to a huge super computer. Computer system 1500 includes a monitor 1502, a display 1504, a housing 1506, a disk drive 1508, a keyboard 1510, and a mouse 1512. Disk 1514 is a computer-readable medium used to transfer data to and from computer system 1500.

FIG. 15B is an example of a block diagram for computer system 1500. Attached to system bus 1520 are a wide variety of subsystems. Processor(s) 1522 (also referred to as central processing units, or CPUs) are coupled to storage devices, including memory 1524. Memory 1524 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1526 is also coupled bi-directionally to CPU 1522; it provides additional data storage capacity and may also include any of the computer-readable media described below. Fixed disk 1526 may be used to store programs, data, and the like and is typically a secondary storage medium (such as a hard disk) that is slower than primary storage. It will be appreciated that the information retained within fixed disk 1526 may, in appropriate cases, be incorporated in standard fashion as virtual memory in memory 1524. Removable disk 1514 may take the form of the computer-readable media described below.

CPU 1522 is also coupled to a variety of input/output devices, such as display 1504, keyboard 1510, mouse 1512, and speakers 1530. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1522 optionally may be coupled to another computer or telecommunications network using network interface 1540. With such a network interface, it is contemplated that the CPU might receive information from the network, or might output information to the network in the course of performing the above-described method steps. Furthermore, method embodiments of the present invention may execute solely upon CPU 1522 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In one embodiment, the computer system 1500 may be used to design the adiabatic RF pulse. In another embodiment, the adiabatic RF pulse may be designed on one or more other computer systems and then programmed into the computer system. A $B_0$ field is applied by the magnetic system 1404 to the MRI system 1400 (step 1308). A sequence of RF pulses including the designed adiabatic RF pulse is applied by the magnetic system 1404 to the MRI system 1400 to provide excitation (step 1312). A signal is read out at an echo from the MRI system (step 1316). An image is created from a Fourier transform of the received signal (step 1320). The image may then be displayed on the display 1504 (step 1324).

Because an embodiment of the invention provides an adiabatic RF pulse, the MRI system 1400 is able to have some $B_1$ inhomogeneities, which may be caused by surface coils or a high main magnetic field of the MRI system 1400.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A computer implemented method for providing an adiabatic RF pulse that is an inversion or refocusing pulse for a RF pulse sequence, for a magnetic resonance imaging system, comprising:
    determining a linear phase frequency profile ($F_{lp}(\omega)$) for the adiabatic RF pulse;
    applying a quadratic phase to the linear phase frequency profile for the adiabatic RF pulse to obtain $F(\omega)$, wherein the applying the quadratic phase comprises setting $F(\omega)=F_{lp}(\omega) e^{ik\omega^2}$, where k is a specified constant and $\omega$ is a frequency vector over which the spectral profile is defined;
    setting a polynomial $\beta$=Fourier Transform ($F(\omega)$);
    determining a corresponding minimum phase $\alpha$ polynomial for the $\beta$ polynomial; setting ($\alpha,\beta$) as inputs to an inverse Shinnar Le-Roux transform to generate an adiabatic RF waveform; and
    truncating the adiabatic RF waveform to produce the adiabatic RF pulse, wherein a pulse duration and a transition width is specified, wherein k>0.03π/(effective transition width) where effective transition width is given by $(\omega_s-\omega_p)/(N+1)$ and k<$k_{max}$, where $k_{max}$ is a value at which the adiabatic RF pulse is truncated at 25% of a maximum RF amplitude.

2. The method, as recited in claim 1, wherein k>0.1π/(effective transition width) and where $k_{max}$ is a value at which the adiabatic RF pulse is truncated at 5% of a maximum RF amplitude.

3. The method, as recited in claim 2, wherein the determining the linear phase frequency profile comprises determining a linear phase finite impulse response filter with a magnitude response that is equal to a desired spectral profile of the pulse.

4. The method, as recited in claim 3, wherein the linear phase finite impulse response filter minimizes a weighted, integrated squared error between an ideal piecewise linear function and a magnitude response of the filter over a set of specified frequency bands.

5. The method, as recited in claim 4, wherein the adiabatic RF pulse is an 180° RF pulse.

6. The method, as recited in claim 5, wherein the adiabatic RF pulse is used as a refocusing or inversion pulse in conjunction with at least one excitation pulse within a pulse sequence which is applied by a magnetic resonance imaging system to create a magnetic resonance image.

7. The method, as recited in claim 6, wherein the magnetic resonance imaging system uses surface coils or a high magnetic field sufficient to cause $B_1$ inhomogeneities.

8. The method, as recited in claim 1, wherein the adiabatic RF pulse is an 180° RF pulse.

9. The method, as recited in claim 1, wherein the adiabatic RF pulse is used as a refocusing or inversion pulse in conjunction with at least one excitation pulse within a pulse sequence which is applied by a magnetic resonance imaging system to create a magnetic resonance image.

10. A method for magnetic resonance imaging (MRI) in an MRI system, comprising:
    designing an adiabatic RF pulse that is an inversion or refocusing pulse for a RF pulse sequence, for a magnetic resonance imaging system, comprising:
        determining a linear phase frequency profile ($F_{lp}(\omega)$) for the adiabatic RF pulse;
        applying a quadratic phase to the linear phase frequency profile for the adiabatic RF pulse to obtain $F(\omega)$, wherein the applying the quadratic phase comprises setting $F(\omega)=F_{lp}(\omega) e^{ik\omega^2}$, where k is a specified constant and $\omega$ is a frequency vector over which the spectral profile is defined;
        setting a polynomial $\beta$=Fourier Transform ($F(\omega)$);
        determining a corresponding minimum phase $\alpha$ polynomial for the $\beta$ polynomial;
        setting ($\alpha,\beta$) as inputs to an inverse Shinnar Le-Roux transform to generate an adiabatic RF waveform; and
        truncating the adiabatic RF waveform to produce the adiabatic RF pulse, wherein a pulse duration and a transition width is specified, wherein k>0.03π/(effective transition width) where effective transition width is given by $(\omega_s-\omega_p)/(N+1)$ and k<$k_{max}$, where $k_{max}$ is a value at which the adiabatic RF pulse is truncated at 25% of a maximum RF amplitude;
    applying a $B_0$ field;
    applying the a sequence of RF pulses including designed adiabatic RF pulse for excitation;
    reading out a signal at an echo; and
    creating an image from a Fourier transform of the read out signal.

11. The method, as recited in claim 10, wherein k>0.1π/(effective transition width) and where $k_{max}$ is a value at which the adiabatic RF pulse is truncated at 5% of a maximum RF amplitude.

12. The method of claim 11, wherein the designed adiabatic RF pulse is largely insensitive to $B_1$ inhomogeneities.

13. The method, as recited in claim 12, wherein the magnetic resonance imaging system uses surface coils or a high main magnetic field resulting in $B_1$ inhomogeneities.

14. The method, as recited in claim 10, wherein the determining the linear phase frequency profile comprises determining a linear phase finite impulse response filter with a magnitude response that is equal to a desired spectral profile of the pulse.

15. The method, as recited in claim 14, wherein the linear phase finite impulse response filter minimizes a weighted, integrated squared error between an ideal piecewise linear function and a magnitude response of the filter over a set of specified frequency bands.

16. The method, as recited in claim 10, wherein the adiabatic RF pulse is an 180° RF pulse.

17. The method, as recited in claim 10, further comprising displaying the created image.

18. An apparatus for providing magnetic resonance imaging, comprising:
    a magnetic resonance imaging excitation and detection system; and
    a controller electrically connected to the magnetic resonance imaging excitation and detection system, comprising:
        a display;
        at least one processor; and
        non-transitory computer readable media, comprising:
            computer readable code for designing an adiabatic RF pulse that is an inversion or refocusing pulse for a RF pulse sequence for the magnetic resonance imaging excitation and detection system, comprising:
                computer readable code for determining the a linear phase frequency profile ($F_{lp}(\omega)$) for the adiabatic RF pulse;
                computer readable code for applying a quadratic phase to the linear phase frequency profile for the adiabatic RF pulse to obtain $F(\omega)$, wherein the applying the quadratic phase comprises setting $F(\omega)=F_{lp}(\omega)e^{ik\omega^2}$, where k is a specified constant and $\omega$ is a frequency vector over which the spectral profile is defined;

computer readable code for setting a polynomial $\beta$=Fourier Transform ($F(\omega)$);

computer readable code for determining a corresponding minimum phase $\alpha$ polynomial for the $\beta$ polynomial;

computer readable code for setting ($\alpha,\beta$) as inputs to an inverse Shinnar Le-Roux transform to generate an adiabatic RF waveform; and computer readable code for truncating the adiabatic RF waveform to produce the adiabatic RF pulse, wherein a pulse duration and a transition width is specified, wherein k>$0.03\pi$/(effective transition width) where effective transition width is given by $(\omega_s-\omega_p)/(N+1)$ and k<$k_{max}$, where $k_{max}$ is a value at which the adiabatic RF pulse is truncated at 25% of a maximum RF amplitude;

computer readable code for applying the a sequence of RF pulses including designed adiabatic RF pulse for excitation;

computer readable code for reading out a signal at an echo; and computer readable code for creating an image from a Fourier transform of the read out signal.

19. The apparatus, as recited in claim 18, further comprising computer readable code for displaying the created image on the display.

20. The apparatus, as recited in claim 18, wherein k>$0.1\pi$/(effective transition width) and where $k_{max}$ is a value at which the adiabatic RF pulse is truncated at 5% of a maximum RF amplitude.

* * * * *